United States Patent [19]

Rostami

[11] Patent Number: 5,071,925
[45] Date of Patent: Dec. 10, 1991

[54] POLYMER COMPOSITIONS

[75] Inventor: Shamsedin Rostami, Middlesbrough, England

[73] Assignee: Imperial Chemical Industries PLC, London, England

[21] Appl. No.: 428,436

[22] Filed: Oct. 30, 1989

Related U.S. Application Data

[63] Continuation of Ser. No. 279,268, Dec. 1, 1988, abandoned, which is a continuation of Ser. No. 890,343, Jul. 29, 1986, abandoned.

[30] Foreign Application Priority Data

Jul. 29, 1985 [GB] United Kingdom ................ 8519060

[51] Int. Cl.$^5$ ...................... C08L 61/00; C08L 81/06
[52] U.S. Cl. .................................. 525/434; 525/436; 525/906
[58] Field of Search ................. 525/434, 436, 906

[56] References Cited

U.S. PATENT DOCUMENTS

| | | | |
|---|---|---|---|
| 3,712,932 | 1/1973 | Balme et al. | 525/434 |
| 4,293,670 | 10/1981 | Robeson et al. | 525/436 |
| 4,435,350 | 3/1984 | Fukushima et al. | 264/280 |
| 4,503,168 | 3/1985 | Hartsing | 525/434 |
| 4,624,997 | 11/1986 | Robeson et al. | 525/471 |

FOREIGN PATENT DOCUMENTS

| | | |
|---|---|---|
| 0091117 | 10/1983 | European Pat. Off. . |
| 0111327 | 6/1984 | European Pat. Off. . |
| 0138129 | 4/1985 | European Pat. Off. . |
| 0163464 | 12/1985 | European Pat. Off. . |
| 0211604 | 2/1987 | European Pat. Off. . |
| 2108983A | 5/1983 | United Kingdom . |

OTHER PUBLICATIONS

PCT-Polymeric Articles and Methods of Manufacture thereof.
Abstract-38-Plastics Fabr., Uses, vol. 99, 1983.

Primary Examiner—Ana L. Carrillo
Attorney, Agent, or Firm—Cushman, Darby & Cushman

[57] ABSTRACT

A polymer composition contains a polyarylketone, a polyarylsulphone and a polyimide. The polyketone may be a polyaryletheretherketone, and the polyarylsulphone may be a polyarylethersulphone. The polyimide may be a polyetherimide in which the repeating group contains the unit

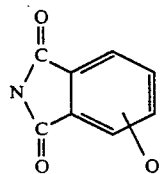

The composition contains at least 5% by weight of the polyarylketone and the polyarylsulphone and at least 10% of the polyimide. The proportion of the polyarylketone is preferably 30 to 70% by weight. The proportion of polyarylsulphone is preferably 15 to 40% by weight. The proportion of polyimide is preferably 10 to 30% by weight. A composition of 60% by weight of polyaryletheretherketone; 20% by weight of polyarylethersulphone and 20% by weight of polyetherimide forms a mixture with good compatibility, has a high glass transition temperature and retains a melting point close to that of the polyaryletheretherketone.

9 Claims, No Drawings

POLYMER COMPOSITIONS

This is a continuation of application Ser. No. 07/279,268, filed Dec. 1, 1988, now abandoned which is a continuation of Ser. No. 06/890,343, filed July 29, 1986 now abandoned.

The present invention relates to polymer compositions and in particular to polymer compositions containing polyarylethers.

Polyarylethers containing sulphone groups are generally referred to as polysulphones or polyethersulphones and, for convenience hereafter, such materials will be referred to as "polysulphones". Polymers of this type have been available commercially for some years and are suitable for use in applications in which elevated temperatures may be experienced. The glass transition temperatures of polysulphones are quite high, for example 200° C. or higher, and these polymers retain many of their mechnical properties with only a little deterioration up to temperatures close to the glass transition temperature of the polymer. However, since most polysulphones are amorphous materials, they lose most of their mechanical strength at the glass transition temperature. Other types of polyarylethers which are known contain ketone groups and are generally referred to as polyketones or polyetherketones (for convenience hereafter, such materials will be referred to as "polyketones"). Unlike the polysulphones, the polyketones are generally crystalline and hence have improved chemical resistance compared to the polysulphones. However, the glass transition temperature of the more simple polyketones is less than that of most polysulphones although the melting point of the polyketones is considerably above the glass transition temperature of the polysulphones. Many of the uses proposed for polyketones are such that the polymer is subjected, at least intermittently, to elevated temperatures. Whilst polysulphones or polyketones have properties which make them suitable for use at elevated temperatures, more demanding conditions of use require the retention of mechanical properties at high temperature and a resistance to attack by many chemical environments.

To satisfy the more demanding conditions of use, copolymers may be prepared which contain both sulphone and ketone groups. However, to obtain a desired combination of high temperature properties and chemical resistance is difficult, particularly since these properties are desirably achieved together with a relatively low melting point to minimise degradation during processing of the polymer. Furthermore, the properties of copolymers are dependent on the copolymer composition and hence can be adjusted only by changing the polymerisation recipe. Copolymers having a useful balance of properties may require the use of monomers which are not readily available and hence are expensive.

As an alternative to copolymerisation, blending of polymers has been used to obtain polymer compositions having a desired combination of properties. However, we have found that polysulphones and polyketones are not generally compatible with each other and hence blends of these polymers do not appear capable of providing a useful combination of high temperature properties and chemical resistance. Unexpectedly, we have now found that the addition of a further component to a blend of a polysulphone and a polyketone gives a composition having a useful combination of properties.

According to the present invention there is provided a polymer composition which contains at least 5% by weight of a polyarylsulphone; at least 5% by weight of a polyarylketone; and at least 10% by weight of a polyimide.

The balance of properties of the polymer composition is dependent on the specific material which is used as each component and also on the proportions of the various components.

The polyarylsulphone component is typically a material having repeating units of the general formula $$-Ar-SO_2-$$

where
Ar is a divalent aromatic residue and may vary from repeating unit to repeating unit in the polymer chain.

In the polyarylsulphone, the group Ar may be derived from a mono- or poly-nuclear hydrocarbon containing one or more aromatic nuclei. Thus, the group Ar may be a divalent residue of benzene, biphenyl, terphenyl, naphthalene, indene or fluorene, and may be substituted with substituents which are not such as to interfer with the preparation of the polyarylsulphone. Such substituents, if present, can be halogen atoms, hydrocarbon groups, ether groups or thioether groups. It is generally preferred that at least some of the groups Ar contain two aromatic groups which are linked together through a non-aromatic linking group. Specifically, it is preferred that at least some of the groups Ar have the general formula, $$-Ar^1-Y-Ar^1-$$

where
each $Ar^1$, which may be the same or different, is an optionally substituted divalent aromatic hydrocarbon residue,
Y is $-O-$, $-S-$, $-SO-$, $-SO_2-$, $-CO-$, an optionally substituted divalent aliphatic hydrocarbon residue, or a group $$-(Y^1-Ar^1)_m-Y^1-;$$

each $Y^1$, which may be the same or different is $-O-$, $-S-$, $-SO-$, $-SO_2-$, $-CO-$ or an optionally substituted divalent aliphatic hydrocarbon residue; and
m is an integer.

Preferred polyarylsulphones are those having repeating units of the general formula $$-Ar^1-Y-Ar^1-SO_2-$$

where $Ar^1$ and Y are as defined.

The groups $Ar^1$ are preferably para-phenylene groups or 4,4'-biphenylene groups. The groups Y may be $-O-$ or $-C(CH_3)_2-$ or group $-(Y^1-Ar^1)_m-Y^1-$ in which each $Y^1$ may be the same or different and, when the value of m is greater than one, each $Ar^1$ group may be the same or different. Preferably $Y^1$ is $-O-$, $-SO_2-$ or $-C(CH_3)_2-$. In the group $-(Y^1-Ar^1)_m-Y^1-$, the value of m is conveniently 1, 2 or 3. The group $-(Y^1-Ar^1)_m-Y^1-$ may be, for example, a group $-O-Ph-O-$; a group $-O-Ph-Ph-O-$; a group $-O-Ph-iPr-Ph-O-$ or a group $-O-Ph-SO_2-Ph-O-Ph-$ where Ph is a para-phenylene group; and iPr is a group —C(CH$_3$)$_2$—. It will be appreciated that some polymers of this type may be regarded as copolymers containing different divalent aromatic residues which are linked together through non-aromatic linking groups such as oxygen atoms. The polyarylsulphone may contain ketone groups but it is preferred that the ketone groups are present in an amount of not more than 25% of the total of the groups —SO$_2$— and —CO—.

The polyarylsulphone may be one which can be represented by repeating units of the formula —Ph—O—Ph—SO$_2$—   I —Ph—O—Ph—O—Ph—SO$_2$—;   II —Ph—O—Ph—iPr—Ph—O—Ph—SO$_2$—; or   III —Ph—O—Ph—SO$_2$—Ph—O—Ph—SO$_2$—Ph—Ph—SO$_2$—.   IV The repeating units IV may, alternatively, be regarded as repeating units —Ph—SO$_2$—Ph—   IVa and —Ph—SO$_2$—Ph—Ph—SO$_2$—Ph—   IVa, linked together through ether linkages and hereafter reference to repeating units IV is used to include the repeating units IVa and IVb linked through ether linkages.

The polyarylsulphone may consist essentially of repeating units I, II, III or IV or may be a copolymer containing at least one of the repeating units I, II, III and IV. Such copolymers may contain other repeating units or may be a mixture of two, or more, of the repeating units I, II, III and IV, for example a copolymer containing the repeating units I and II or the repeating units I and IV.

We have obtained a polymer composition having a useful combination of properties when the polyarylsulphone is a polymer consisting essentially of the repeating units I.

The polyarylketone component is typically a material having repeating units of the general formula —Ar—CO— where Ar is as defined. In the polyarylketone, it is preferred that the group Ar is —Ar$^1$—Y—Ar$^1$— in which the group Y is —O— or a group —Y$^1$—Ar$^1$)$_m$Y$^1$— in which Y$^1$ is —O— and/or —CO— and there is. at least one —O—, and m is 1 or 2 The polyarylketone may contain sulphone groups but it is preferred that the sulphone groups are present in an amount of not more than 25% of the total of the groups —SO$_2$— and —CO—.

The polyarylketone may be one which can be represented by repeating units of the formula —Ph—O—Ph—CO—;

—Ph—O—Ph—O—Ph—CO—;

or

—Ph—O—Ph—Ph—O—Ph—CO—.

The polyarylketone may consist essentially of repeating units V or VI or may be a copolymer containing at least one of the repeating units V or VI. Such copolymers may contain the repeating units VII, or other repeating units, or may be a mixture of the repeating units V and VI, for example a copolymer containing the repeating units VI together with the repeating units V or the repeating units VII.

We have obtained a polymer composition having a useful combination of properties when the polyarylketone is a polymer consisting essentially of the repeating units VI.

The polyimide is typically a material in which the repeating units contain a group

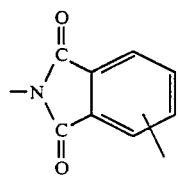

A)

or a group

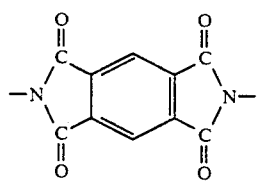

B)

For convenience hereafter, the group A will be represented by NIM whilst the mirror image thereof, that is the group.

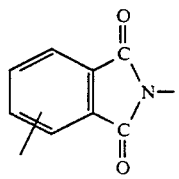

will be represented by MIN and the group B will be represented by NIMIN.

The polyimide may be one containing repeating units of the general formulae

—NIM—Y$^2$—(Ar—Y$^2$)$_n$MIN—Ar—;

or

—Y$^2$—Ar—(Y$^2$)$_n$MIN—(Ar)$_n$;

or

—NIMIN—(Y$^2$)$_n$Ar—(Y$^2$)$_n$.

wherein
NIM, MIN, NIMIN, and Ar are as defined;
each Y$^2$, which may be the same or different, is —CONH—, NHCO— or a group Y$^1$,
n is zero or an integer; and
Y$^1$ is as defined.

The polyimide may be a polyetherimide or a polyamideimide, particularly one in which the ether or amide group is bonded directly to the benzene ring of the imide group. The value of n is typically combination of properties when the polyarylketone is a polymer zero, one or two.

The polyimide may be one having repeating units of the formula

| | |
|---|---|
| —NIM—O—Ph—iPr—Ph—O—MIN—mPh—; | VIII |
| —NIM—O—Ph—Ph—O—MIN—Ph—O—Ph—; | IX |
| —NIM—CO—MIN—Ph—O—Ph— | X |
| —CONH—Ph—SO$_2$—Ph—NHCO—MIN—Ph—; | XI |
| —CH$_2$—Ph—NHCO—MIN—Ph—; | XII |
| —O—Ph—O—Ph—O—MIN—; | XII |
| —O—Ph—O—Ph—MIN—; and | XIV |
| —NIMIN—Ph—CH$_2$—Ph— | XV | where NIM, MIN, NIMIN, iPr and Ph are as defined; and m Ph is a meta-phenylene group.

We have obtained a polymer composition having a useful combination of properties when the polyimide is a polymer consisting essentially of the repeating units VIII.

Polymer compositions in accordance with the present invention include compositions wherein the polyarylsulphone consists essentially of the repeating units I, II or IV or is a copolymer which consists essentially of the repeating units I with either the repeating units II or IV; the polyarylketone consists essentially of the repeat units V or VI or is a copolymer which consists essentially of the repeating units VI with either the repeating units V or VII; and the polyimide consists essentially of the repeating units VIII.

A useful polymer composition in accordance with the present invention is one wherein the polyarylsulphone consists essentially of the repeating units I, the polyarylketone consists essentially of the repeating units VI and the polyimide consists essentially of the repeating units VIII.

The polymers which are components of the polymer composition of the present invention are materials of high molecular weight. The molecular weight may be determined using any technique which is applicable to a given polymer. Thus, the melt viscosity, reduced viscosity or inherent viscosity may be used as an indication of the molecular weight of the polymer. The polymers which are used in accordance with the present invention generally have a molecular weight which is such that the melt viscosity of each polymer is at least 0.01 kNsm$^{-2}$, and preferably is at least 0.1 kNsm$^{-2}$. It is generally preferred that each polymer has a melt viscosity of not more than 4 kNsm$^{-2}$ and especially not more than 2.0 kNsm$^{-2}$. The melt viscosity of the polymer is measured using a ram extruder fitted with a 3.175 mm × 0.5 mm die operating at a shear rate of 1000s$^{-1}$. The temperature at which the melt viscosity is determined is dependent on the glass transition temperature, or the melting temperature, of the polymer and is typically 400° C. for polymers having a melting temperature of up to about 370° C. Alternatively, an indication of the molecular weight can be obtained from a determination of the reduced viscosity or inherent viscosity of a solution of polymer in 100 cm$^3$ of a suitable solvent. Reduced viscosity is determined using one gramme of polymer and inherent viscosity is determined using 0.1 gramme of polymer. The solvent used will be dependent on the particular polymer and can be dimethylformamide and/or chlorinated solvents for several polyarylsulphones, concentrated sulphuric acid for several polyketones and m-cresol or chlorinated solvents for several polyimides. Preferred polymers have a reduced viscosity or inherent viscosity in the range 0.2 up to 3.0, especially 0.4 to 1.5, measured at 25° C. It is preferred that the polyketone has an inherent viscosity of at least 0.7, or even at least 1.0.

The proportions of the various polymer components present in the polymer composition will be dependent on the characteristics of each polymer component and the properties which are desired.

We generally prefer that the proportion of the polyarylsulphone is from 5 to 70% by weight of the total polymer composition. The proportion of the polyarylketone is preferably from 5 to 85% by weight of the total polymer composition. The polyimide is preferably from 10 to 40% by weight of the total polymer composition. More preferred compositions contain from 15 to 40% by weight of polyarylsulphone; from 30 to 70% by weight of polyarylketone and from 10 to 30% by weight of polyimide. In the polymer composition, the amounts of polyarylsulphone, polyarylketone and polyimide preferably aggregate to 100% by weight of the polymeric components of the polymer composition.

A polymer composition having 20% by weight of a polyarylsulphone consisting essentially of repeating units I, 60% by weight of a polyarylketone consisting essentially of repeating units VI and 20% by weight of a polyimide consisting essentially of repeating units VIII has been found to have a useful combination of properties. More specifically, if the molten polymer composition is rapidly quenched, the resulting amorphous product has a glass transition temperature which is about 20° C. higher than that of the polyarylketone, as measured by differential scanning calorimetry (DSC). If the amorphous material is annealed at a temperature above the measured glass transition temperature, preferably at a temperature in excess of 200° C., or if the composition is slowly cooled from the melt, for example at a rate of about 10° C./minute, a crystalline product is obtained. This crystalline product has a maximum loss modulus temperature of about 190° C. and a melting temperature of about 330° C. In comparison with this, a blend of the same polyarylsulphone and the same polyarylketone has poor compatibility, and shows two distinct glass transition temperatures.

Polyarylsulphones which can be used in the compositions of the present invention, and the preparation of such polyarylsulphones, are described, inter alia, in British Patent Specifications 1016245; 1060546; 1078234; 1109842; 1122192; 1133561; 1153035; 1153528; 1163332; 1177183; 1234301; 1264900; 1265144; 1286673; 1296383; 1298821 and 1303252; Canadian patent specification 847963 and German OLS specifications 1938806 and 2433400.

Polyarylketones can be prepared by techniques similar to those used for polyarylsulpones and, in particular, a polyarylketone containing repeating units VI, which is crystalline and tough and has an inherent viscosity of at least 0.7, is described in more detail in European Patent Publication No. 001879.

Polyimides, in particular polyetherimides, and the preparation thereof are described, inter alia, in British Patent Specifications 1353962; 1463300; 1465825 and 1550985 and U.S. Pat. Nos. 3,838,097; 3,887,588; 4,024,110 and 4,107,147.

For many applications, the polymer composition of the present invention may be used with few, if any, additives, other than stabilisers. However, other additives may be incorporated into the polymer composition. A wide range of additives have been proposed for use in polymer compositions and many of these additives may be incorporated into the polymer composition of the present invention and, for convenience hereafter, the term "filled polymer composition" will be used to mean the polymer composition of the present invention which also contains an additive. The filled polymer composition can include, for example, inorganic and organic fibrous fillers such as glass fibre, carbon fibre and polyparaphenyleneterephthalamide fibre; organic and inorganic fillers such as polytetrafluoroethylene, graphite, boron nitride, mica, talc and vermiculite; nucleating agents; and stabilisers for the various polymer components.

It is preferred that the total proportion of additives, when present, is at least 0.1%, and does not exceed 80%, by weight of the filled polymer composition and especially that the proportion of the additives does not exceed 70% by weight. The filled polymer composition can contain, for example 5 to 30% by weight of boron nitride; or at least 20% by weight of short glass or carbon fibre; or 50 to 70%, especially about 60%, by volume of continuous glass or carbon fibre; or a mixture of a fluorine-containing polymer, graphite and an organic or inorganic fibrous filler wherein the total proportion of these additives is preferably at least 20%, and not more than 50%, by weight of the filled polymer composition.

The polymer composition of the present invention may be made by admixture of the polymer components in a suitable mixing machine to effect blending, for example by particle or melt blending. More specifically, the three polymer components in the form of dry powders or granules, can be mixed together using a suitable solids blending technique such as tumble blending or a high speed mixer. The blend thus obtained may be extruded into a lace which is chopped to give granules. The granules can be used to produce shaped articles by the use of a suitable forming operation, for example injection moulding or extrusion, to give a shaped article.

Filled polymer compositions may be obtained in a similar manner by mixing the additive or additives with the components of the polymer composition or with granules of the polymer composition.

The polymer compositions of the present invention may be formed into films, foil or injection moulded articles. Films, foils powder or granules of the polymer composition can be laminated with a fibrous filler material in the form of mats or cloths.

Filled polymer compositions containing fibrous filler materials may be obtained by passing essentially continuous fibre, for example glass or carbon fibre, through a melt of the polymer composition or a molten mixture containing the polymer composition. The product obtained is a fibre coated with the polymer composition and the coated fibre may be used alone, or together with other materials, for example a further quantity of the polymer composition, to form a shaped article by an appropriate shaping technique. The production of filled polymer compositions by this technique is described in more detail in European Patent Specifications 56703; 102158 and 102159.

In the production of shaped articles from the polymer compositions of the present invention or from filled polymer compositions, it is desirable that the crystallinity of the polymer composition is developed as far as possible during the fabrication process, including any annealing stage, because subsequent use of an article which can continue to crystallise in use can result in dimensional changes occurring in the article with consequent warping or cracking and general change in physical properties. Furthermore, increased crystallinity results in improved environmental resistance.

Crystallinity in the polymer compositions of the present invention is due mainly, and in most of the polymer compositions solely, to the presence of the polyarylketone. To achieve improved crystallisation behaviour, the polymer compositions of the present invention may be modified by forming, particularly on the polymeric chains of the polyarylketone component, terminal ionic groups —A—X, where A is an anion and X is a metal cation.

The anion is preferably selected from sulphonate carboxylate, sulphinate, phosphonate, phosphate, phenate and thiophenate and the metal cation is an alkali metal or alkaline earth metal.

In polymer compositions in accordance with this aspect of the present invention, the temperature for the onset of crystallisation, Tc, may be raised by at least 2° C. in comparison with a similar polymer composition not containing the ionic end-groups. However, useful polymer compositions are obtained even when there is little or no change in Tc if sufficient nucleation results from the presence of end groups to increase the number of spherulites in comparison with a similar polymer composition not containing the ionic end groups.

Modified polymers which may be included in the polymer composition are most suitably produced by reaction of a preformed polymer with reactive species containing the ionic group. Procedures for the production of modified polymers are described in more detail in our copending European Patent Application Publication No. 152161. The procedure described in our said published European Patent Application is generally applicable to the modification of polymers for inclusion in the polymer compositions of the present invention.

The polymer compositions and filled polymer compositions have properties which make them suitable for high temperature applications where good solvent resistance is also desirable. The polymer compositions also have good electrical insulation characteristics and hence are useful for applications requiring such characteristics, particularly in combination with high temperature properties.

Thus, as a further aspect of the present invention, there is provided an electrical conductor having a coating formed from the polymer composition of the present invention. More specifically, an electrical conductor, or a bundle of insulated electrical conductors, is provided with a coating formed from the polymer composition of the present invention. If several insulated electrical conductors are coated, the insulating layer on each individual conductor may be formed from the polymer composition.

In a further application in which the electrical properties of the polymer composition are beneficial, shaped articles formed from the polymer compositions or filled polymer compositions can be used for the production of printed circuit boards since the polymer composition shows good resistance to distortion by molten solder.

Thus, as a further aspect of the present invention there is provided a circuit board of which the substrate is formed from a polymer composition or a filled polymer composition, in accordance with the present invention.

Further aspects of the present invention are now set out in the following illustrative examples.

EXAMPLE 1

Polyethersulphone ('Victrex' (Registered Trade Mark) PES aromatic polymer 4800 G grade, obtainable from Imperial Chemical Industries PLC), polyetheretherketone ('Victrex' (Registered Trade Mark) PEEK aromatic polymer 450 G grade, obtainable from Imperial Chemical Industries PLC) and polyetherimide (Ultem, grade 1000, obtainable from the General Electric Company of Schenectady, N.Y., were dry mixed by tumble blending the granules for 5 to 10 minutes in the proportions of 20% by weight of polyethersulphone, 60% by weight of polyetheretherketone and 20% by weight of polyetherimide. The polyethersulphone was a polyarylsulphone consisting essentially of repeating units I, the polyetheretherketone was a polyarylketone consisting essentially of repeating units VI and the polyetherimide was a polyimide consisting essentially of repeating units VIII.

The blend of granules was then melt homogenised in a Brabender rheometer operating at a temperature of 400° C. for 5 to 10 minutes, and the molten blend was compression moulded to form test samples 50 mm × 12.7 mm × 0.5 mm using the following conditions. The molten blend was placed in an electrically heated press between two sheets of aluminium foil. The blend was preheated in the press at 380° C. for 5 minutes without applying pressure and were then pressured for 10 minutes at 400° C. at an applied pressure of 0.14 MN/m² (20 psi). The pressure was released, the moulding allowed to cool to 150° C. and was then ejected from the press and allowed to cool in air. The moulding obtained was subjected to dynamic mechanical analysis to determine some of the properties of the blend, which are reported in Table Two

EXAMPLE 2

A further polymer compositions was prepared using different proportions of the polyarylsulphone, polyarylketone and polyimide. The details of the compositions are given in Table One and the properties are given in Table Two

TABLE ONE

| Example | Component (a) | Proportion (% wt) | E″ max (°C.) (b) | Tm (°C.) (b) |
|---|---|---|---|---|
| 1 | PS | 20 | 190 | 330 |
|   | PK | 60 |   |   |
|   | PI | 20 |   |   |
| 2 | PS | 35 | 195 | 330 |
|   | PK | 35 |   |   |

TABLE ONE-continued

| Example | Component (a) | Proportion (% wt) | E″ max (°C.) (b) | Tm (°C.) (b) |
|---|---|---|---|---|
|   | PI | 30 |   |   |

Notes to Table One
(a) PS is polyethersulphone 'Victex' PES aromatic polymer 4800 G grade
PK is polyetheretherketone, 'Victrex' PEEK aromatic polymer 450 G grade
PI is polyetherimide, Ultem grade 1000
(b) E″ max is the maximum loss modulus temperature and
Tm is the melting temperature, both as determined by dynamic mechanical analysis using a DuPont 981 Dynamic Mechanical Analyser and heating at 5° C./minute from −140° C. with an oscillation amplitude of 0.2 mm as recommended for polymers.

Tm is the melting temperature, both as determined by dynamic mechanical analysis using a DuPont 981 Dynamic Mechanical Analyser and heating at 5° C./minute from −140° C. with an oscillation amplitude of 0.2 mm as recommended for polymers.

TABLE TWO

| Temperature (°C.) | DMA Stiffness (c) | |
|---|---|---|
|   | Eg 1 (d) | Eg 2 (d) |
| 40 | 2.6 | 2.35 |
| 80 | 2.4 | 2.15 |
| 120 | 2.3 | 2.13 |
| 160 | 2.1 | 2.02 |
| 180 | 1.5 | 1.75 |
| 200 | 0.8 | 0.5 |
| 240 | 0.35 | 0.125 |

Notes to Table Two
(c) DMA Stiffness is the stiffness of the blend (in $GNm^{-2}$) as determined by dynamic mechanical analysis using the apparatus and procedure of Note (b) to Table One.
(d) Eg 1 and Eg 2 are the polymer compositions of Example 1 and Example 2 respectively.

EXAMPLE 3

A polymer composition of a polyetherketone of formula V, with the polyethersulphone and polyetherimide as used in Example 1 was prepared as described in Example 1 using 60% by weight of the polyetherketone and 20% by weight of each of the polyethersulphone and the polyetherimide. The composition had a maximum loss modulus temperature of 190° C. Other properties of the composition are set out in Table Three.

EXAMPLE 4

The procedure of Example 3 was repeated with the exception that the polyethersulphone was a polyarylsulphone consisting essentially of repeating units IV. The composition had a maximum loss modulus temperature of 193° C. Other properties of the composition are set out in Table Three.

EXAMPLE 5

The procedure of Example 1 was repeated using 72% by weight of the polyetheretherketone used in Example 1, 18% by weight of a polyarylsulphone consisting essentially of repeating units IV, and 10% by weight of the polyetherimide as used in Example 1. The composition had a maximum loss modulus temperature of 170° C. Other properties of the composition are set out in Table Three.

TABLE THREE

| Temperature (°C.) | DMA Stiffness (c) | | |
|---|---|---|---|
|   | Eg 3 (e) | Eg 4 (e) | Eg 5 (e) |
| 40 | 2.65 | 2.40 | 2.10 |
| 80 | 2.50 | 2.25 | 2.00 |
| 120 | 2.35 | 2.10 | 1.70 |

TABLE THREE-continued

| Temperature | DMA Stiffness (c) | | |
|---|---|---|---|
| (°C.) | Eg 3 (e) | Eg 4 (e) | Eg 5 (e) |
| 160 | 2.20 | 1.90 | 1.25 |
| 180 | 1.50 | 1.40 | 0.50 |
| 200 | 0.50 | 0.55 | 0.35 |
| 220 | 0.30 | 0.30 | 0.25 |
| 240 | 0.15 | 0.25 | 0.20 |

Notes to Table Three
(c) is as defined in Notes to Table Two.
(e) Eg 3, 4 and 5 are, respectively, the polymer compositions of Examples 3, 4 and 5.

EXAMPLE 6

A composition as described in Example 1 was prepared by blending the three components together and then subjecting the particulate blend to melt blending at 380° C. using a single screw Plaston extruder having a one inch (25.4 mm) diameter screw. The extruded lace was granulated. The granules obtained were injection moulded into test pieces using an Arburg injection moulding machine operating at 380° C. with a mould temperature of about 160° C. The mechanical properties of the moulded samples are reported in Table 4.

EXAMPLE 7

The process of Example 6 was repeated using different proportions of the polysulphone, polyketone and polyimide, the conditions otherwise being the same. The proportions of the components were 10% by weight of polyethersulphone, 80% by weight of polyetheretherketone and 10% by weight of polyetherimide.

EXAMPLE 8

The process of Example 6 was repeated using different proportions of the polysulphone, polyketone and polyimide, the conditions otherwise being the same. The proportions of the components were 70% by weight of polyethersulphone, 20% by weight of polyetheretherketone and 10% by weight of polyetherimide.

TABLE FOUR

| Sample (f) | Flex Mod (GN/m$^2$) (h) | Tensile Strength (MN/m$^2$) (i) | Impact Fracture Toughness (MN/m$^{3/2}$) (j) |
|---|---|---|---|
| 6 | 3.45 | 101 | 2.05 |
| 7 | 3.37 | 101 | 3.06 |
| 8 | 2.74 | 83.3 | 2.46 |

Notes to Table Four
(f) Samples 6, 7 and 8 are, respectively, the polymer compositions of Examples 6, 7 and 8.
(h) Flexural modulus is determined at 23° C. using a central deflection rate of 5 mm/minute and a three point bending method.
(i) Tensile strength is measured using a tensile loading to give an elongation rate of 5 mm/minute.
(j) Impact fracture toughness is measured using a three point bending technique at a temperature of −65° C.

The heat distortion temperature of the products of Examples 6 and 7, and also of the polyetheretherketone of Example 1, were determined using the procedure of ASTM Test Method D648 with an applied load of 1.8 MN/m$^2$.

The results are reported in Table Five.

TABLE FIVE

| Sample (f) (k) | HDT (°C.) (l) |
|---|---|
| 6 | 187 |
| 7 | 176 |
| A | 160 |

Notes to Table Five
(f) is as defined in Notes to Table Four.
(k) A is polyetheretherketone, 'Victrex' PEEK aromatic polymer as used in Example 1.
(l) HDT is determined according to the procedure of ASTM Test Method D648 using an applied load of 1.8 MN/m$^2$.

I claim:

1. A polymer composition comprising a blend of 3 polymers:
   (i) a polyarylethersulphone having as repeating units at least one of $$-Ph-O-Ph-SO_2- \qquad I$$
$$-Ph-O-Ph-O-Ph-SO_2- \qquad II$$
$$-Ph-O-Ph-iPr-Ph-O-Ph-SO_2- \qquad III$$
$$-Ph-O-Ph-SO_2-Ph-O-Ph-SO_2-Ph-Ph-SO_2- \qquad IV$$

where Ph is paraphenylene and iPr is $C(CH_3)_2$, and having an inherent viscosity in the range 0.4 to 1.5 (measured at 25° C. using a 0.1% weight/volume solution of the polyarylethersulphone in a solvent selected from dimethylformamide and chlorinated solvents);

(ii) a crystalline tough polyaryletherketone having as repeating units at least one of $$-Ph-O-Ph-CO- \qquad V$$
$$Ph-O-Ph-O-Ph-CO- \qquad VI$$
$$Ph-O-Ph-Ph-O-Ph-CO- \qquad VII$$

where Ph is paraphenylene, and having an inherent viscosity of at least 0.7 (measured at 25° C. using a 0.1% weight/volume solution of the polyaryletherketone in concentrated sulfuric acid);

(iii) an aromatic polyetherimide having an inherent viscosity in the range 0.4 to 1.5 (measured at 25° C. using a 0.1% weight/volume solution of the polyetherimide in a solvent selected from m-cresol or chlorinated solvents);

the content of said polyethersulphone being at least 5% by weight, the content of said crystalline tough polyaryletherketone being at least 5% by weight and the content of said polyetherimide being sufficient to increase the mechanical compatibility of said polyethersulphone and polyetherketone.

2. The polymer composition of claim 1 which contains from 5-70% by weight of the polyarylethersulphone; from 5-85% by weight of the crystalline tough polyaryletherketone and from 10-40% by weight of the polyetherimide, the total weight of all components adding to 100%.

3. The polymer composition of claim 1 which contains from 15-40% by weight of the polyarylethersulphone; from 30-70% by weight of the crystalline tough polyaryletherketone and from 10-30% by weight of the polyetherimide the total weight of all components adding to 100%.

4. The polymer composition of claim 1 wherein the polyetherimide is a material in which the repeating units contain one or more of the following groups A) 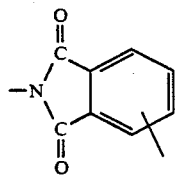
B) 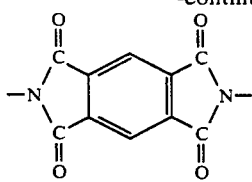
5. The polymer composition of claim 4 wherein the polyetherimide is a material including one or more of the following repeating units with the following formulas:
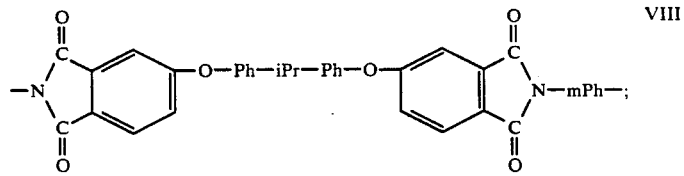 VIII
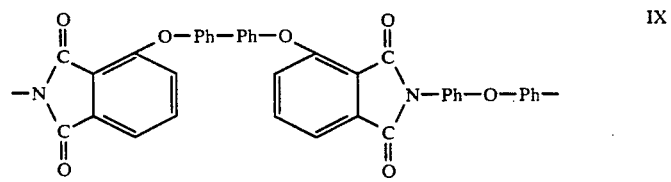 IX
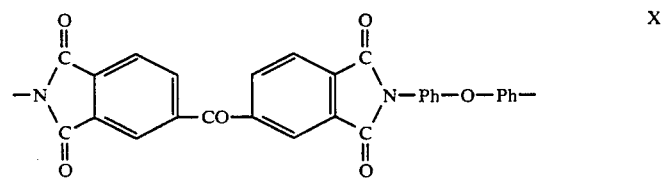 X
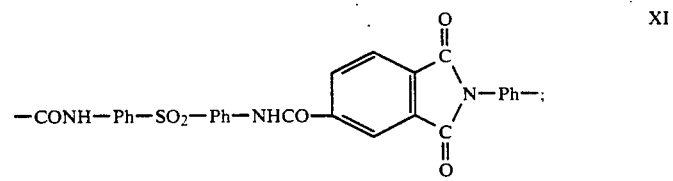 XI
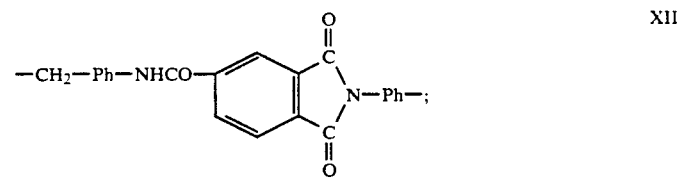 XII
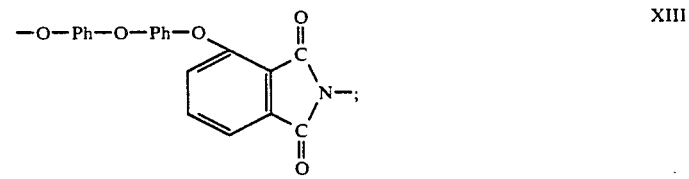 XIII
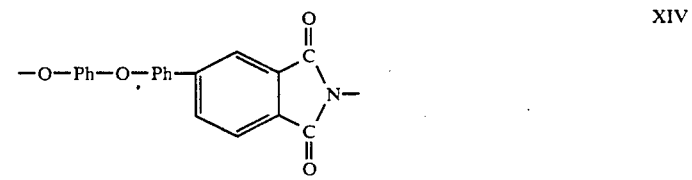 XIV

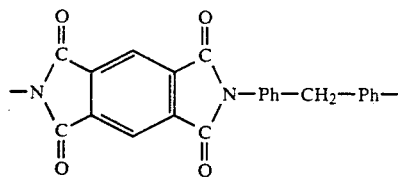

wherein Ph is para-phenylene, iPr is —C(CH₃)₂—, and mPh is metaphenylene.

6. The polymer composition of claim 5 wherein the polyarylethersulphone consists essentially of the repeating units

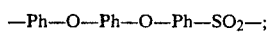

the polyaryletherketone consists essentially of the repeating units

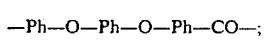

and the polyetherimide consists essentially of the repeating units

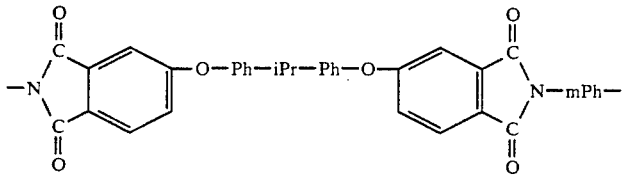

wherein Ph is para-phenylene, iPr is —C(CH₃)₂—, and mPh is metaphenylene.

7. The polymer composition of claim 1 which includes at least one additive which is an inorganic or organic fibrous filler; an organic or inorganic particulate filler; a nucleating agent or a stabilizer for one of the polymer components.

8. A process for the production of a polymer composition which comprises mixing together a polyarylethersulphone which may contain ketone groups in an amount no more than 25% of the total of SO₂ and CO groups, a polyaryletherketone which may contain sulphone groups in an amount of no more than 25% of the total SO₂ and CO groups and a polyetherimide, in the amounts of at least 5% by weight of the polyarylethersulphone and at least 5% by weight of the polyaryletherketone and at least 10% by weight of the polyetherimide, the total of the polymer components aggregating to 100% by weight.

9. The process of claim 8 wherein at least one additive which is an inorganic or organic fibrous filler, an organic or inorganic particulate filler, a nucleating agent or a stabilizer for one of the polymer components is mixed with the polyarylethersulphone, polyaryletherketone and polyetherimide.

* * * * *